United States Patent
West et al.

(10) Patent No.: US 8,039,385 B1
(45) Date of Patent: Oct. 18, 2011

(54) IC DEVICES HAVING TSVS INCLUDING PROTRUDING TIPS HAVING IMC BLOCKING TIP ENDS

(75) Inventors: Jeffrey A. West, Dallas, TX (US); Young-Joon Park, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/880,629

(22) Filed: Sep. 13, 2010

(51) Int. Cl.
*H01L 21/44* (2006.01)
*H01L 21/4763* (2006.01)

(52) U.S. Cl. ........ 438/613; 438/637; 438/639; 438/652; 257/E23.033; 257/E23.067; 257/E23.069

(58) Field of Classification Search .................. 438/613, 438/615, 637, 639, 652; 257/E23.033, E23.067, 257/E23.069
See application file for complete search history.

(56) References Cited

U.S. PATENT DOCUMENTS

| | | | |
|---|---|---|---|
| 7,833,895 B2 * | 11/2010 | Bonifield et al. | ............ 438/598 |
| 2009/0278238 A1 | 11/2009 | Bonifield et al. | |
| 2009/0278245 A1 | 11/2009 | Bonifield et al. | |

* cited by examiner

*Primary Examiner* — Alexander Ghyka
*Assistant Examiner* — Seahvosh Nikmanesh
(74) *Attorney, Agent, or Firm* — Yingsheng Tung; Wade J. Brady, III; Frederick J. Telecky, Jr.

(57) ABSTRACT

A through substrate via (TSV) die includes a plurality of TSVs including an outer dielectric sleeve and an inner metal core and protruding TSV tips including sidewalls that emerge from the TSV die. A passivation layer lateral to the protruding TSV tips is on a portion of the sidewalls of the protruding TSV tips. The passivation layers is absent from a distal portion of the protruding TSV tips to provide an exposed portion of the inner metal core. The TSV tips include bulbous distal tip ends including a first metal layer including a first metal other than solder and a second metal layer including a second metal other than solder that covers the exposed tip portion. The bulbous distal tip ends cover a portion of the TSV sidewalls and are over a topmost surface of the outer dielectric sleeve, and have a maximum cross sectional area that is $\geq 25\%$ more as compared to a cross sectional area of the protruding TSV tips below the bulbous distal tip ends.

9 Claims, 5 Drawing Sheets

IC DEVICES HAVING TSVS INCLUDING PROTRUDING TIPS HAVING IMC BLOCKING TIP ENDS

FIELD

Disclosed embodiments relate to integrated circuits (ICs) including TSV ICs that include protruding TSV tips.

BACKGROUND

As known in the art, through-substrate vias (referred to herein as TSVs), which are commonly referred to as through-silicon vias, are vertical electrical connections that extend the full thickness of the wafer from one of the electrically conductive levels formed on the topside semiconductor surface of the IC die (e.g., contact level or one of the BEOL metal interconnect levels) to its bottomside surface. The vertical electrical paths are significantly shortened relative to conventional wire bonding technology, generally leading to significantly faster device operation. In one arrangement, the TSVs terminate on one side of the IC die referred to herein as a "TSV die" as protruding TSV tips, such as protruding from the bottomside surface of the TSV die. The TSV die can be bonded face-up or face-down, and can be bonded to from both sides to enable formation of stacked IC devices.

The TSV area is often limited because the TSV area cannot generally be increased due to area restrictions on the TSV die and/or TSV imparted stress on one or more layers on the TSV die. For a conventional solder mediated joint involving a TSV tip, since solder has a relatively low electromigration (EM) current limit (e.g., typical EM-limited current density for conventional solder is around $10^4$ A/cm$^2$, about one hundred times lower than that of Cu or Al), the EM current density through the TSV-comprising joint is generally limited by the interfacial area between the TSV tip and the overlying solder on the TSV tips.

Moreover, applied to stacked die assemblies, TSV areas that are significantly smaller as compared to the adjoining bond pads or bonding features on a top IC die bonded to the TSV die generally limit the overall EM performance for the stacked die assembly. Conventional solutions to this EM problem involve addition of a patterned metal pad over the TSV tip enabled by adding an additional backside metal step, or by formation of additional TSVs (to provide TSVs in parallel) to reduce the current in selected TSVs on the TSV die.

SUMMARY

Disclosed embodiments describe TSV die having protruding TSV tips that include distal tip ends that can solve the EM problem described above without the added cost and cycle time of adding a patterned metal pad over the TSV tips or the die area penalty associated with including additional TSVs in parallel. The Inventor has also recognized that disclosed embodiments avoid or at least significantly delay the consumption of the inner metal core of the TSV from forming an inter-metallic compound (IMC) with overlying Sn-based solder in the case of solder mediated joints, which helps prevent IMC-induced cracking of the outer dielectric sleeve that can result in failures (e.g., leakage or shorts) on the TSV die, especially near the point where the protruding TSV tip exits the bottomside of the die.

The distal tip ends comprise a first metal layer including a first metal other than solder covering an exposed portion of the protruding TSV tips and a second metal layer including a second metal other than solder that is different from the first metal on the first metal layer. The first metal layer together with the second metal layer provides a bulbous distal tip end that covers a portion of the TSV sidewalls and a topmost surface of the outer dielectric sleeve, and provides a cross sectional area that is $\geq 25\%$ more as compared to a cross sectional area of the protruding TSV tip below the bulbous distal tip end.

One disclosed embodiment is a method of forming TSV die that includes plating a first metal layer exclusive of solder on a distal portion of a protruding TSV tip of a TSV that comprises an outer dielectric sleeve and an inner metal core, and plating a second metal layer exclusive of solder that is different from the first metal layer on the first metal layer. The first metal layer together with the second metal layer provides a bulbous distal tip end for the protruding TSV tip that covers a portion of the TSV sidewalls and a topmost surface of the outer dielectric sleeve, and provides a cross sectional area that is $\geq 25\%$ more as compared to a cross sectional area of the protruding TSV tip below the bulbous distal tip end.

The method can further comprise depositing a dielectric passivation layer on the bottomside surface of a wafer that includes a plurality of TSV die including over the protruding TSV tips. The passivation layer can then be etched (e.g., dry etched) to reveal a distal portion of the protruding TSV tips including an exposed portion of the inner metal cores of the TSVs. The bulbous distal tip ends can then be formed on the distal portion of the protruding TSV tips. The forming of bulbous distal tip ends can comprise selectively electrolessly plating the first and second metal layer.

DETAILED DESCRIPTION

Figure 1A:
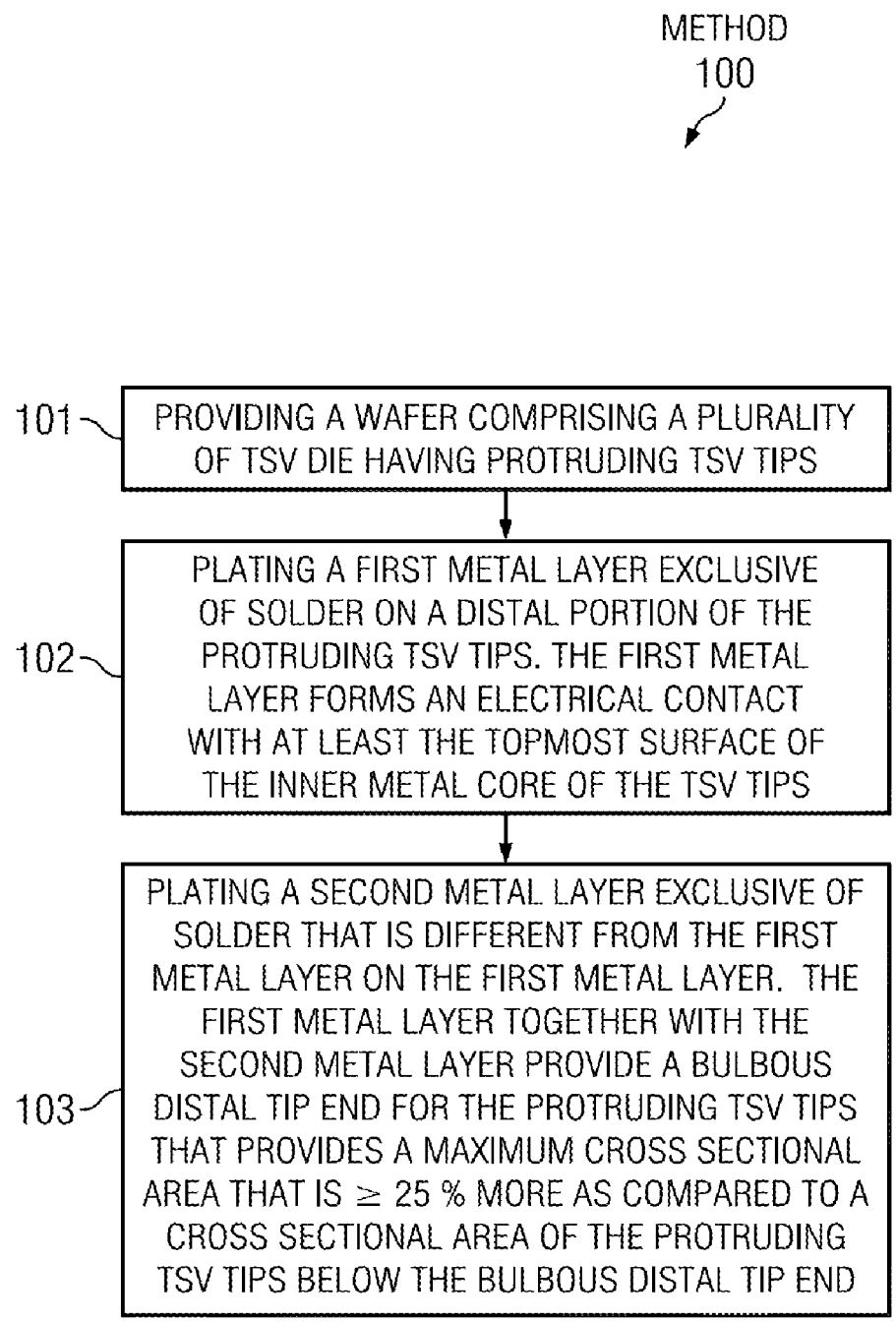
FIG. 1A is a flow chart that shows steps in an exemplary method of forming TSV die, according to an embodiment of the invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1A is a flow chart that shows steps in an exemplary method 100 of forming TSV die, according to an embodiment of the invention. Step 101 comprises providing a wafer comprising a plurality of TSV die. The TSV die includes at least one, and generally a plurality of TSVs that comprise an inner metal core and an outer dielectric sleeve that extends the full thickness of the die from the topside semiconductor surface (generally coupled to the contact level or one of the BEOL metal layers (e.g., M1, M2, etc.)) to protruding TSV tips that emerge from the bottomside surface of the TSV die. The inner metal core can comprise Cu in one embodiment. Other electrically conductive materials can be used for the inner metal core. In one embodiment the TSV diameter is $\leq 12$ µm, such as 8.5 to 10 µm in one particular embodiment.

The outer dielectric sleeve can comprise materials such as silicon oxide, silicon nitride, phosphorus-doped silicate glass (PSG), silicon oxynitride, or certain CVD polymers (e.g., parylene). The outer dielectric sleeve is typically 0.2 to 5 µm thick. In the case of copper and certain other metals for the inner metal core, a metal diffusion barrier layer referred to herein as a "TSV barrier" is generally added, such as a refractory metal or a refractory metal nitride. For example, TSV barrier materials can include materials including Ta, W, Mo, Ti, TiW, TiN, TaN, WN, TiSiN or TaSiN, which can be deposited by physical vapor deposition (PVD) or chemical vapor deposition (CVD). The TSV barrier is typically 100-500 Å thick. The distal portion of the TSV tip includes an exposed (i.e., dielectric sleeve free) area that at least exposes the topmost surface of the inner metal core to allow electrical contact thereto.

Step 102 comprises plating a first metal layer exclusive of solder on a distal portion of a protruding TSV tip. The first metal layer forms an electrical contact with at least the topmost surface of the inner metal core. The first metal layer is generally 1 to 4 µm thick. The first metal layer provides both an IMC block and current spreader function. The first metal layer can comprise materials including Ni, Pd, Co, Cr, Rh, NiP, NiB, CoWP or CoP, for example. The plating can comprise electroless plating. As known in the art of plating, electroless plating is a selective deposition process that only deposits on certain exposed metal or semiconductor surfaces, not on dielectrics such as polymers, oxides and nitrides, and thus does not involve lithography to generate a pattern or an etching step to remove the excess deposited material. In another embodiment, electroplating can be used by building a patterned layer using lithography so that an electroplated pad can be created over the TSV tip to localize the deposition to the tip region using an electroplating process.

Step 103 comprises plating a second metal layer exclusive of solder that is different from the first metal layer on the first metal layer. The plating can comprise electroless plating. As with step 102 described above, the plating can comprise electroplating. The first metal layer together with the second metal layer provide a bulbous distal tip end for the protruding TSV tip. The bulbous distal tip end covers a portion of the TSV sidewalls and a topmost surface of the outer dielectric sleeve, and provides a maximum cross sectional area that is $\geq 25\%$ more as compared to a cross sectional area of the protruding TSV tip below the bulbous distal tip end. In another embodiment, the bulbous distal tip end has a maximum cross sectional area that is $\geq 40\%$ more as compared to a cross sectional area of the protruding TSV tip below the bulbous distal tip end. For example the TSV tip diameter can be 6 to 10 µm, and the combined thickness of the first and second metal layers can be 1 to 5 µm thick.

For electroless processes, which as known in the art are characterized by isotropic deposition patterns beginning on certain metal (e.g., Cu) or semiconductor surfaces, the deposited thickness in dimensions perpendicular to the length dimension of the TSV tip is typically 70% to 85% of the deposited thickness in the length dimension of the TSV tip. Accordingly, a 4 µm thick deposition thickness provides about a 6 µm increase in the width dimension of the TSV.

In a first particular embodiment, the first metal layer comprises Ni and the second metal layer comprises Cu, Pt, Pd or Au. For example, the Ni can be 1 to 4 µm thick, and the second metal layer can comprise 2 to 5 µm thick Cu. Ni provides an IMC block, while the second metal embodied as a Cu layer both contributes to subsequent conversion of the solder into a $Cu_xSn_y$ IMC and delays the full conversion of Ni in the first metal layer to IMC, thereby extending the EM capability.

By forming the bulbous tip ends, the effective tip area is increased significantly, which reduces the current density at the interface between the TSV tip and the solder. Moreover, the bulbous tip end blocks/delays IMC formation reaction into the TSV tip. The bulbous distal tip also retards the consumption of the TSV inner metal core (e.g., Cu) from forming IMC with overlying Sn-based solder.

In a second particular embodiment, the first metal layer comprises Ni and the second metal layer comprises Pd. In this second particular embodiment the Pd can be 0.2 to 0.6 µm thick. An immersion Au layer can be deposited on the Pd or other second metal layer in the second particular embodiment to improve solder wetting. The Au layer can be 200 to 500 Å thick. Pd can provide a block to prevent Au diffusion through to the TSV tip and can provide a block to prevent P (e.g., from underlying NiP) from corroding the Au.

Figure 1B:
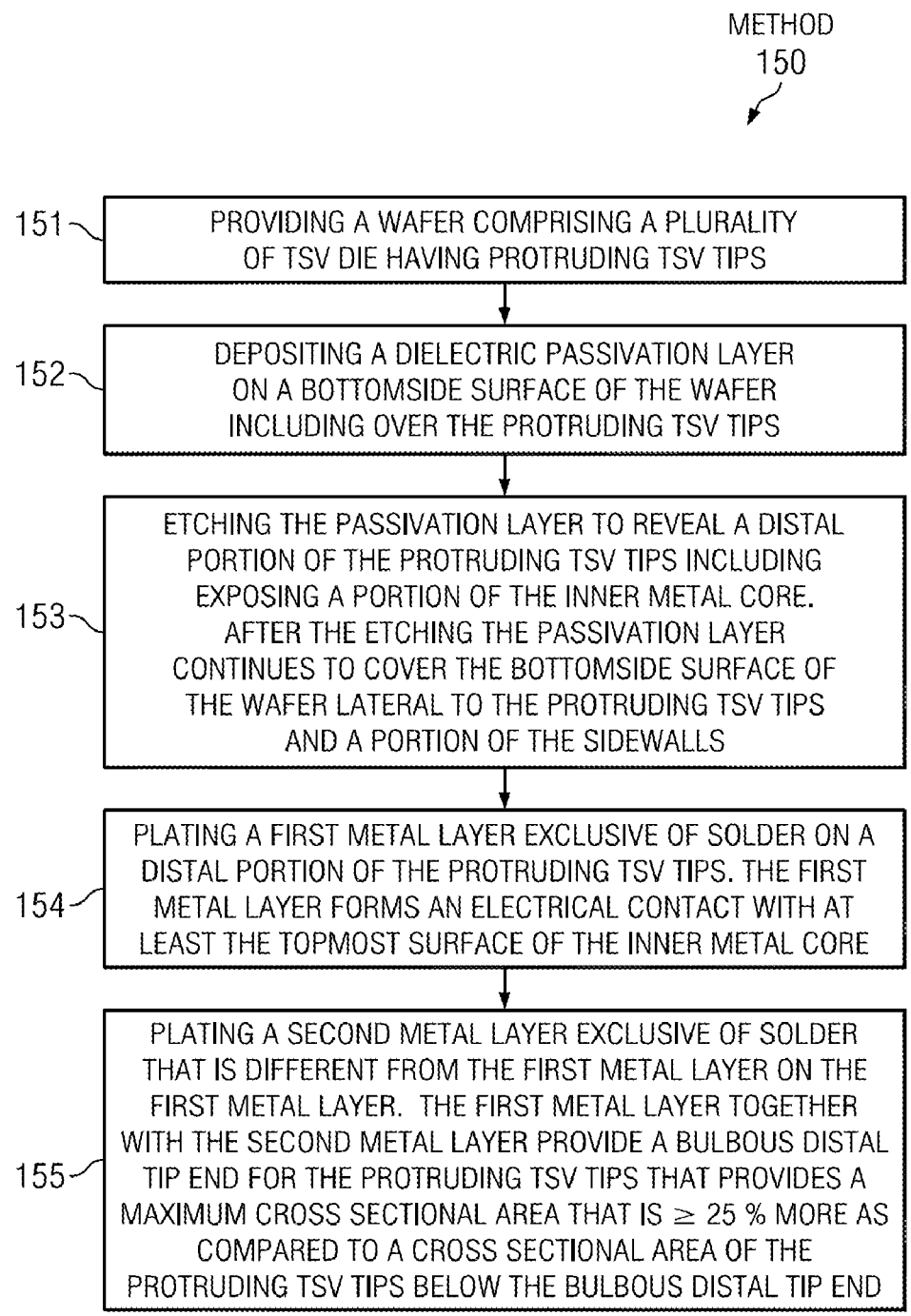
FIG. 1B is a flow chart that shows steps in an exemplary method of forming TSV die, according to another embodiment of the invention.

FIG. 1B is a flow chart that shows steps in an exemplary method 150 of forming TSV die, according to another embodiment of the invention. Step 151 comprises providing a wafer comprising a plurality of TSV die, where each TSV die has a topside semiconductor surface including active circuitry and a bottomside surface, and a plurality of TSVs. The TSVs comprise an inner metal core and an outer dielectric sleeve that extends the full thickness of the die from the topside semiconductor surface (generally coupled to the contact level or one of the BEOL metal layers (e.g., M1, M2, etc.) to protruding TSV tips that emerge from the bottomside surface of the TSV die. The TSV tips include sidewalls.

Step 152 comprises depositing a dielectric passivation layer on the bottomside surface of the wafer including over the protruding TSV tips. In one embodiment the passivation layer is deposited using a spin-on process. However, other deposition processes may be used.

Step 153 comprises etching the passivation layer to reveal a distal portion of the protruding TSV tips including exposing a portion of the inner metal core, wherein after the etching the passivation layer continues to cover the bottomside surface of the wafer lateral to the protruding TSV tips and a portion of the sidewalls. Dry etching can be used for this step. Some wet etch process may also be suitable. For example, one exemplary wet etch process coats the TSV tips with a dielectric polymer that encapsulates the TSV tips, and then a portion of the dielectric polymer is removed from the TSV tips using a solvent to expose a distal tip portion of the TSV tips to permit electrical connection thereto.

In one embodiment step 152 can comprise chemical vapor deposition (CVD) of a dielectric passivation layer comprising silicon nitride or silicon oxynitride, and step 153 can comprise chemical mechanical polishing (CMP) to reveal a distal portion of the protruding TSV tips including exposing a portion of the inner metal core. In this embodiment the metal plating (steps 154, 155 described below) would grow laterally across this passivation layer.

Step 154 is analogous to step 102 in method 100 and comprises plating a first metal layer exclusive of solder on a distal portion of a protruding TSV tip of a TSV. The plating can comprise electroless plating. Step 155 is analogous to step 103 in method 100 and comprises plating a second metal layer exclusive of solder that is different from the first metal layer on the first metal layer. The plating can comprise electroless plating. The first metal layer together with the second metal layer provide a bulbous distal tip end for the protruding TSV tip. The bulbous distal tip end covers a portion of the TSV sidewalls and a topmost surface of the outer dielectric sleeve, and has a maximum cross sectional area that is ≧25% more as compared to a cross sectional area of the protruding TSV tip below the bulbous distal tip end.

Figure 2A:
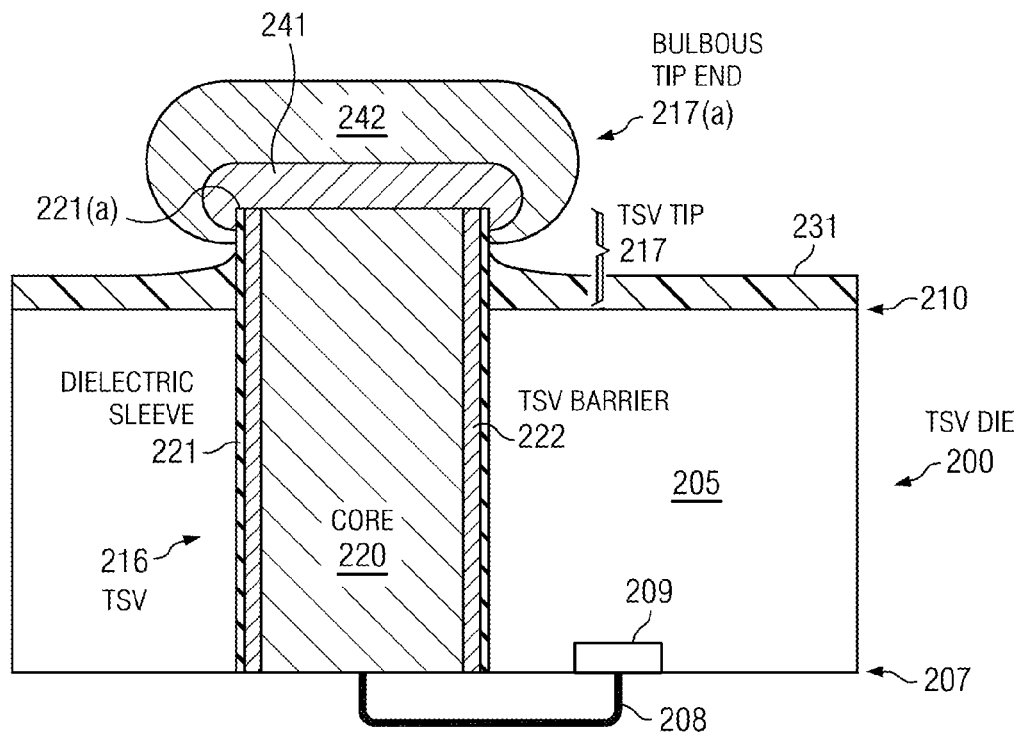
FIG. 2A is a simplified cross sectional depiction of a TSV die comprising a TSV having a bulbous distal tip end, according to an embodiment of the invention.

FIG. 2A is a simplified cross sectional depiction of a TSV die 200 comprising at least one TSV 216 having protruding TSV tip 217 having a bulbous distal tip end 217(*a*), according to an embodiment of the invention. TSV die 200 comprises a substrate 205 including a topside semiconductor surface 207 including active circuitry 209 and a bottomside surface 210. The connector 208 shown depicts the coupling between the TSV 216 on the topside semiconductor surface 207 to the active circuitry 209. The TSV 216 comprises an outer dielectric sleeve 221 and an inner metal core 220, and a TSV barrier layer 222 between the outer dielectric sleeve 221 and an inner metal core 220. The TSV 216 extends from the topside semiconductor surface 207 to protruding TSV tip 217 emerging from the bottomside surface 210. The TSV tip includes sidewalls having outer dielectric sleeve 221 and barrier layer 222 thereon.

A dielectric passivation layer 231 is lateral to the protruding TSV tip 217 including on a portion the sidewalls of the protruding TSV tip 217. The passivation layer 231 is absent from the distal portion of the protruding TSV tip 217 to provide an exposed portion of the inner metal core 220.

A first metal layer 241 that includes a first metal other than solder covers the exposed portion the protruding TSV tip 217. A second metal layer 242 including a second metal other than solder that is different from the first metal is on the first metal layer 241. It can be seen that the first metal layer 241 together with the second metal layer 242 provides a bulbous distal tip end 217(*a*) for the protruding TSV tip 217 that covers a portion of the TSV sidewalls and a topmost surface 221(*a*) of the outer dielectric sleeve 221, and provides a cross sectional area that is ≧25% more as compared to a cross sectional area of the protruding TSV tip 217 below the bulbous distal tip end 217(*a*).

Figure 4:
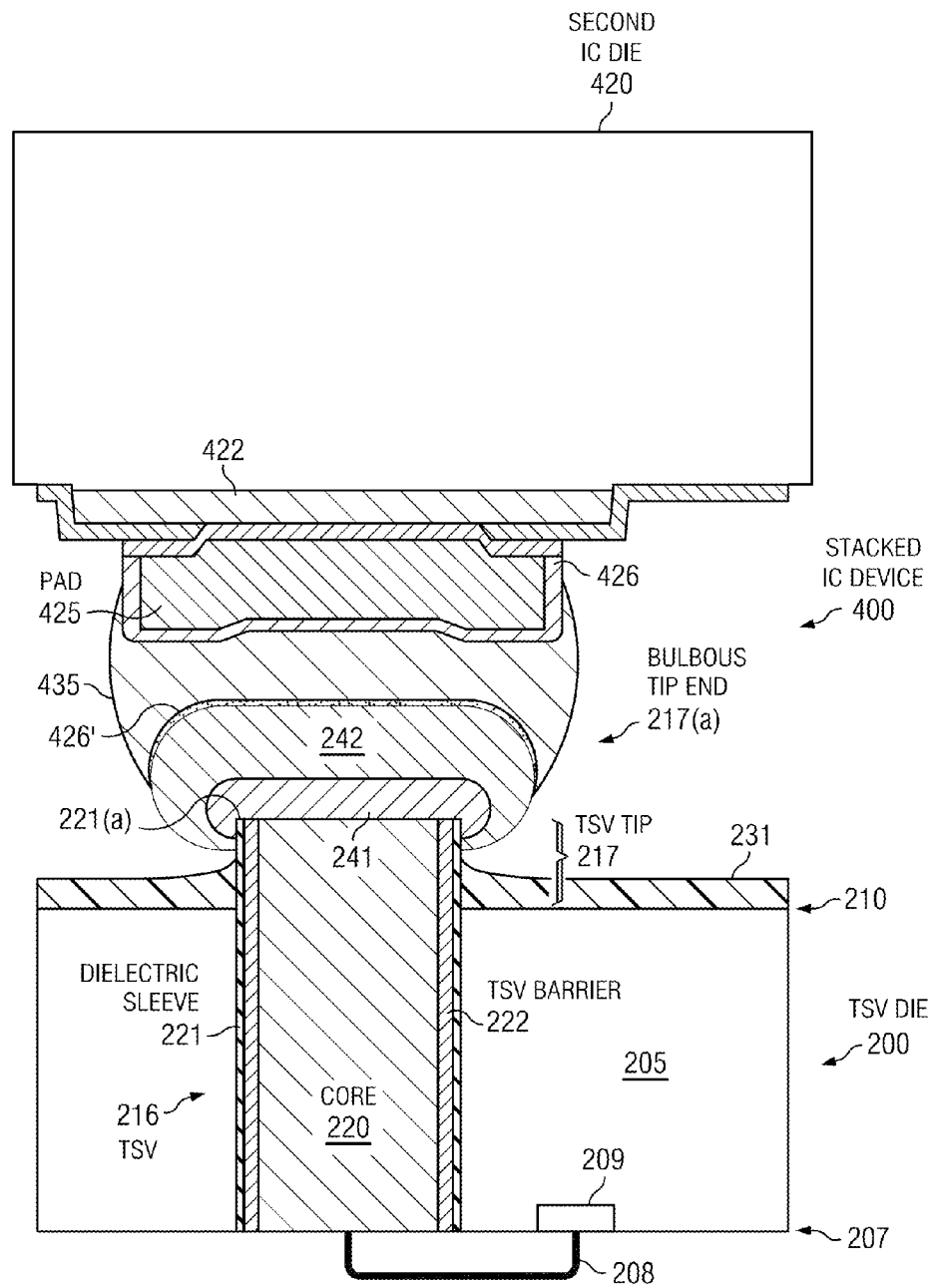
FIG. 4 is a simplified cross sectional depiction of a stacked IC device comprising a TSV die comprising a TSV having a bulbous distal TSV tip end, and a second IC die having a plurality of protruding bonding features with a protruding bonding feature shown joined at a reflowed solder joint to the protruding TSV tip, according to an embodiment of the invention.

During assembly, reliability testing, and during use, solder used in conventional TSV joints will consume inner metal core (e.g., Cu) from the TSV tips when the TSVs lack a metal cap that functions as an IMC barrier, which can lead to conversion of the TSV inner core metal such as Cu to an IMC. The Inventors have recognized that IMC formation induces a volumetric increase that can rupture the surrounding outer dielectric sleeve 221 especially near the point where the protruding TSV tip 217 exits the bottomside surface 210 of the substrate 205. The bulbous tip ends 217(*a*) disclosed herein besides reducing the current density at the TSV tip's interface with the solder, as noted above blocks/delays IMC formation reaction into the TSV tip. The bulbous tip also retards the consumption of the TSV inner metal core (e.g., Cu) from forming IMC with overlying Sn-based solder. FIG. 4 described below shows an exemplary solder joint that couples a TSV tip having a bulbous tip end protruding from a bottomside surface of a TSV die and second IC die having a plurality of protruding bonding features.

Figure 2B:
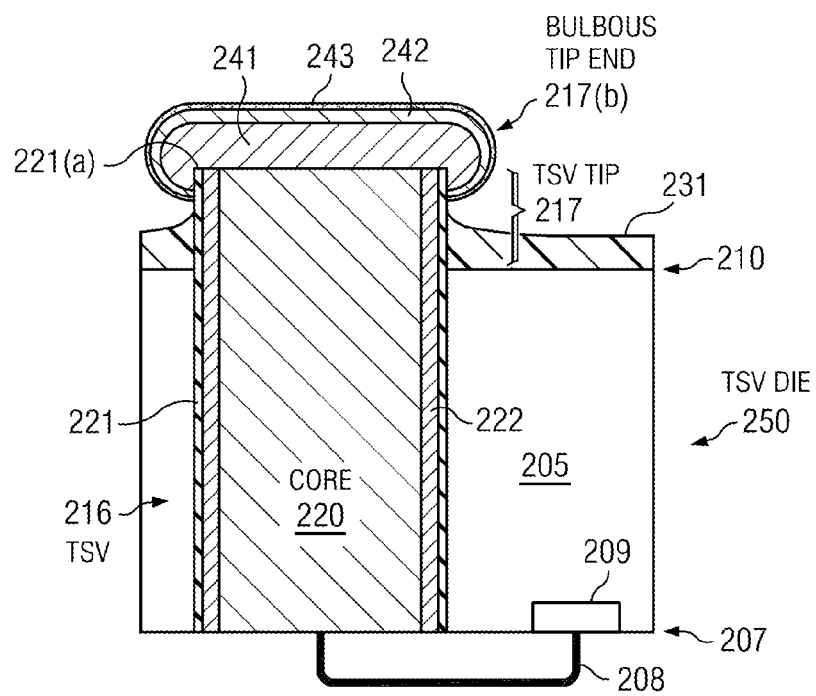
FIG. 2B is a simplified cross sectional depiction of a TSV die comprising a TSV having a bulbous distal tip end, according to another embodiment of the invention.

FIG. 2B is a simplified cross sectional depiction of a TSV die 250 comprising at least one TSV having a bulbous distal tip end, according to another embodiment of the invention. The bulbous tip end 217(*b*) shown in FIG. 2B comprises an optional third metal layer 243, a second metal layer 242 and a first metal layer 241. In this embodiment the first metal layer 241 can comprise Ni (e.g., 1 to 4 μm thick), the second metal layer 242 can comprise Pd (e.g., 0.2 to 0.6 μm thick) and the third metal layer 243 can comprise Au (e.g., 200 to 500 Å thick). As noted above Pd can provide a block for possible Au diffusion and can also provide a block against possible corrosion of the Au by P from underlying NiP.

Figure 3:
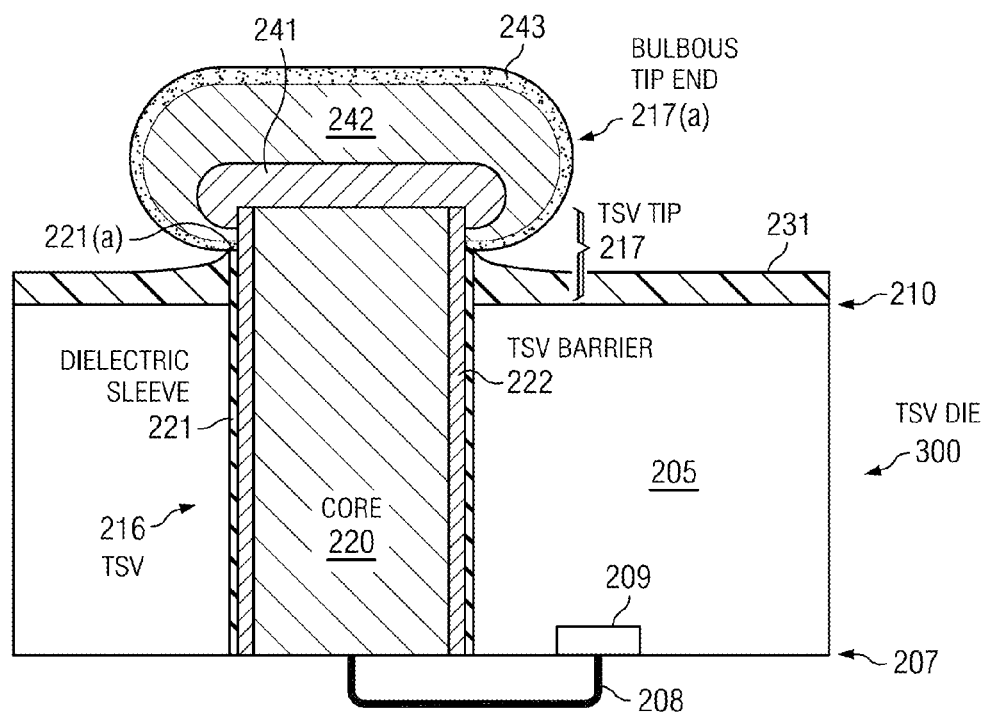
FIG. 3 is a simplified cross sectional depiction of a TSV die comprising a TSV having a bulbous distal tip end related to the embodiment shown in FIG. 2A, modified so that the outer dielectric TSV sleeve extends along the sidewalls of the protruding TSV tips for a distance less than a length of the protruding TSV tips, according to another embodiment of the invention.

FIG. 3 is a simplified cross sectional depiction of a TSV die 300 comprising a TSV 216 having a bulbous distal tip end 217(*a*) related to the embodiment shown in FIG. 2A, modified so that the outer dielectric TSV sleeve 221 extends along the sidewall of the protruding TSV tip 217 for a distance less than a length of the protruding TSV tips 217. This distance, referred to herein as an intermediate distance (Di), can be:

⅓ a length of the protruding TSV tip<Di<the length of the protruding TSV tip−1 μm.

An exemplary method for forming such TSV tips having outer dielectric TSV sleeves 221 that extend along the sidewall of the protruding TSV tip 217 for a distance less than a length of the protruding TSV tips 217 can be found in commonly assigned Pub. U.S. Pat. App. No. 20090278238 to Bonifield, et al.

FIG. 4 is a simplified cross sectional depiction of a stacked IC device 400 comprising a first TSV die 200 (shown in FIG. 2A as described above) comprising a TSV 216 having a bulbous distal TSV tip end 217(*a*), and a second IC die 420 having a plurality of protruding bonding features with a single bonding feature (e.g., copper pad) 425 on a bond pad 422 shown joined at a reflowed solder (e.g., electrolytic SnAg 2.5 wt. % solder) joint 435 to the bulbous tip ends 217(*a*) of the TSV die 200. IMC 426 (e.g., $Cu_xSn_y$) is shown on the bonding feature 425 resulting from the solder reflow processing.

The third metal layer 243 shown in FIG. 2B is not shown in FIG. 4 since it generally completely dissolves and thus fully diffuses into the solder during solder reflow to become included in the reflowed solder joint 435. In addition, another IMC layer 426' is formed between solder in the solder joint 435 and the second metal layer 242, such as a Ni second metal layer. In the case the second metal layer 242 comprises Ni, IMC layer 426' will be much thinner as compared to IMC layer 426 since IMC forms at a faster rate between the bond pad 425 when it is Cu and Sn as compared to the IMC formation rate between Ni and Sn.

FIG. 4 also shows how disclosed bulbous tip ends solves problem of having to build a patterned metal pad over the TSV tips on the backside of the wafer or to add additional TSVs to supply sufficient current to next tier because of EM limitations on the (relatively) smaller TSV tip cross sectional area (e.g., diameter) vs. the adjoining pad 425 by significantly increasing the effective area of the distal end of the TSV tip 217.

The active circuitry formed on the topside semiconductor surface comprises circuit elements that generally include transistors, diodes, capacitors, and resistors, as well as signal lines and other electrical conductors that interconnect these various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A method of forming through substrate via (TSV) die, comprising:
    plating a first metal layer exclusive of solder on a distal portion of a protruding TSV tip of a TSV that includes sidewalls and comprises an outer dielectric sleeve and an inner metal core, and
    plating a second metal layer exclusive of solder that is different from said first metal layer on said first metal layer,
    wherein said first metal layer together with said second metal layer provides a bulbous distal tip end for said protruding TSV tip that covers a portion of said TSV sidewalls and a topmost surface of said outer dielectric sleeve, said bulbous distal tip end having a cross sectional area that is ≧25% more as compared to a cross sectional area of said protruding TSV tip below said bulbous distal tip end.

2. The method of claim 1, wherein said plating said first metal layer and said plating said second metal layer both comprise selective electroless plating, and wherein said bulbous distal tip end is selectively formed on said distal portion of said protruding TSV tip.

3. The method of claim 2:
    wherein said TSV die is on a wafer comprising a plurality of said TSV die, and wherein each of said plurality of TSV die have a topside semiconductor surface including active circuitry and a bottomside surface and including a plurality of said TSVs, wherein said plurality of TSVs extend from said active circuitry on said topside semiconductor surface to said protruding TSV tips emerging from said bottomside surface, and wherein said protruding TSV tips include sidewalls, said method further comprising before said selective electroless plating:
    depositing a passivation layer on said bottomside surface of said wafer including over said protruding TSV tips;
    etching said passivation layer to reveal a distal portion of said protruding TSV tips including exposing a portion of said inner metal core, wherein after said etching said passivation layer continues to cover said bottomside surface of said wafer lateral to said protruding TSV tips and a portion of said sidewalls.

4. The method of claim 3, wherein said depositing comprises chemical vapor deposition (CVD), said passivation layer comprises silicon nitride or silicon oxynitride, and said etching comprises chemical mechanical polishing (CMP).

5. The method of claim 1, wherein said first metal layer comprises Ni, Pd, Co, Cr, Rh, NiP, NiB, CoWP or CoP.

6. The method of claim 5, wherein said first metal layer comprises Ni and second metal layer comprises Cu.

7. The method of claim 5, wherein said first metal layer comprises Ni and said second metal layer comprises Pd.

8. The method of claim 7, further comprising depositing a Au layer on said second metal layer.

9. The method of claim 1, wherein said outer dielectric sleeve extends along said sidewalls of said protruding TSV tip to an intermediate distance (Di), wherein:
    ⅓ a length of said protruding TSV tip<Di<said length of said protruding TSV tip−1 μm.

\* \* \* \* \*